United States Patent
Peng et al.

(10) Patent No.: US 8,068,208 B2
(45) Date of Patent: Nov. 29, 2011

(54) SYSTEM AND METHOD FOR IMPROVING IMMERSION SCANNER OVERLAY PERFORMANCE

(75) Inventors: Jui-Chung Peng, Hsin-Chu (TW); Tzung-Chi Fu, Maioli (TW); Chin-Hsiang Lin, Hsin-Chu (TW); Chien-Hsun Lin, Hsinchu (TW); Chun-Hung Lin, Taoyuan (TW); Yao-Wen Guo, Pingtung County (TW); Shy-Jay Lin, Hsinchu County (TW); Heng-Hsin Liu, Yonghe (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 749 days.

(21) Appl. No.: 11/677,949

(22) Filed: Feb. 22, 2007

(65) Prior Publication Data

US 2008/0129969 A1 Jun. 5, 2008

Related U.S. Application Data

(60) Provisional application No. 60/868,191, filed on Dec. 1, 2006.

(51) Int. Cl.
- *G03B 27/52* (2006.01)
- *G03B 27/68* (2006.01)
- *G03B 27/42* (2006.01)
- *G03B 27/58* (2006.01)
- *G03B 27/60* (2006.01)
- *G03B 27/32* (2006.01)

(52) U.S. Cl. ............. 355/30; 355/52; 355/53; 355/72; 355/73; 355/77

(58) Field of Classification Search ............. 355/30, 355/53, 55, 77, 52, 72–76; 430/8, 20, 311, 430/320, 5, 30; 250/492.1, 492.2, 492.22, 250/548

See application file for complete search history.

(56) References Cited

U.S. PATENT DOCUMENTS

| | | | | |
|---|---|---|---|---|
| 3,648,458 A | * | 3/1972 | McAlister | 60/415 |
| 4,000,626 A | * | 1/1977 | Webber | 62/175 |
| 5,134,436 A | * | 7/1992 | Fujioka | 355/30 |
| 5,435,379 A | * | 7/1995 | Moslehi et al. | 165/80.4 |
| 5,577,552 A | * | 11/1996 | Ebinuma et al. | 165/296 |

(Continued)

FOREIGN PATENT DOCUMENTS

| | | |
|---|---|---|
| EP | 1486827 A2 | 4/2004 |
| EP | 1713155 A1 | 12/2005 |
| JP | 2006005061 A * | 1/2006 |
| WO | WO 2005024517 A2 * | 3/2005 |

OTHER PUBLICATIONS

English translation of JP 2006-005061, published Jan. 5, 2006.*
German Patent Office, Office Action dated Feb. 15, 2011 (with translation), Application No. 102007044633.2-51, 8 pages.

*Primary Examiner* — Edward Glick
*Assistant Examiner* — Christina Riddle
(74) *Attorney, Agent, or Firm* — Haynes and Boone, LLP (57) ABSTRACT

System and method for improving immersion scanner overlay performance are described. One embodiment is a method of improving overlay performance of an photolithography immersion scanner including a wafer table having lens cooling water ("LCW") disposed in a water channel therein, the wafer table having an input for receiving the LCW into the water channel and an output for expelling the LCW from the water channel. The method includes providing a water tank that connects to at least one of the wafer table input and the wafer table output; monitoring a pressure of water in the water tank; and maintaining the pressure of the water in the water tank at a predetermined level.

17 Claims, 7 Drawing Sheets

U.S. PATENT DOCUMENTS

| | | | | |
|---|---|---|---|---|
| 5,770,899 | A | 6/1998 | Hayashi | |
| 5,885,134 | A * | 3/1999 | Shibata et al. | 451/41 |
| 5,941,083 | A * | 8/1999 | Sada et al. | 62/99 |
| 5,998,889 | A * | 12/1999 | Novak | 310/12 |
| 6,552,773 | B2 * | 4/2003 | Emoto | 355/53 |
| 6,590,633 | B1 * | 7/2003 | Nishi et al. | 355/53 |
| 7,235,483 | B2 * | 6/2007 | Ivanov | 438/678 |
| 2005/0136346 | A1 * | 6/2005 | Ottens et al. | 430/30 |
| 2005/0140946 | A1 * | 6/2005 | Tsuji et al. | 355/30 |
| 2006/0164616 | A1 * | 7/2006 | Okada | 355/53 |
| 2006/0176455 | A1 * | 8/2006 | Nomoto | 355/53 |
| 2007/0070316 | A1 * | 3/2007 | Ehrmann et al. | 355/53 |
| 2007/0188724 | A1 * | 8/2007 | Jacobs et al. | 355/53 |
| 2007/0268469 | A1 * | 11/2007 | Fu et al. | 355/53 |
| 2008/0024748 | A1 * | 1/2008 | Zaal et al. | 355/72 |

* cited by examiner

SYSTEM AND METHOD FOR IMPROVING IMMERSION SCANNER OVERLAY PERFORMANCE

CROSS-REFERENCE

This application claims priority from U.S. Provisional Patent Application Ser. No. 60/868,191, filed on Dec. 1, 2006, which is hereby incorporated by reference in its entirety.

BACKGROUND

The fabrication of integrated circuits ("IC") devices involves the performance of a range of processing steps. In particular, patterned layers of various materials are applied to a substrate to create the desired device. The patterns of the layers must be accurately aligned to ensure proper operation of the resultant circuit. Misalignment of the layers will at best degrade the performance of the IC and at worst render it completely inoperative. As IC designs have become increasingly complex the critical dimensions ("CDs") thereof have been correspondingly reduced, resulting in a reduction in acceptable relative displacement of the various IC device layers.

Currently, most semiconductor devices are manufactured using photolithographic techniques, which involve exposure of a photoresist layer of a substrate to a pattern and the subsequent development of the pattern into permanent form. Semiconductor pattern overlay is the measure of vector displacement from one layer of the IC to another layer. The overlay requirements for a particular IC design are typically determined through a combination of CDs and overlay excursion. When an immersion scanner is used during the exposure process, overlay performance is impacted by internal stresses caused by any change in the pressure of the lens cooling water ("LCW") disposed within a cooling water channel of the wafer table for stabilizing the temperature of the wafer.

BRIEF DESCRIPTION OF THE DRAWINGS

The features and advantages of a system and method for overlay performance of an immersion scanner for use in semiconductor fabrication in accordance with an embodiment will be more clearly understood from the following description taken in conjunction with the accompanying drawings in which like reference numerals designate similar or corresponding elements, regions, and portions, and in which.

DETAILED DESCRIPTION

Figure 1:
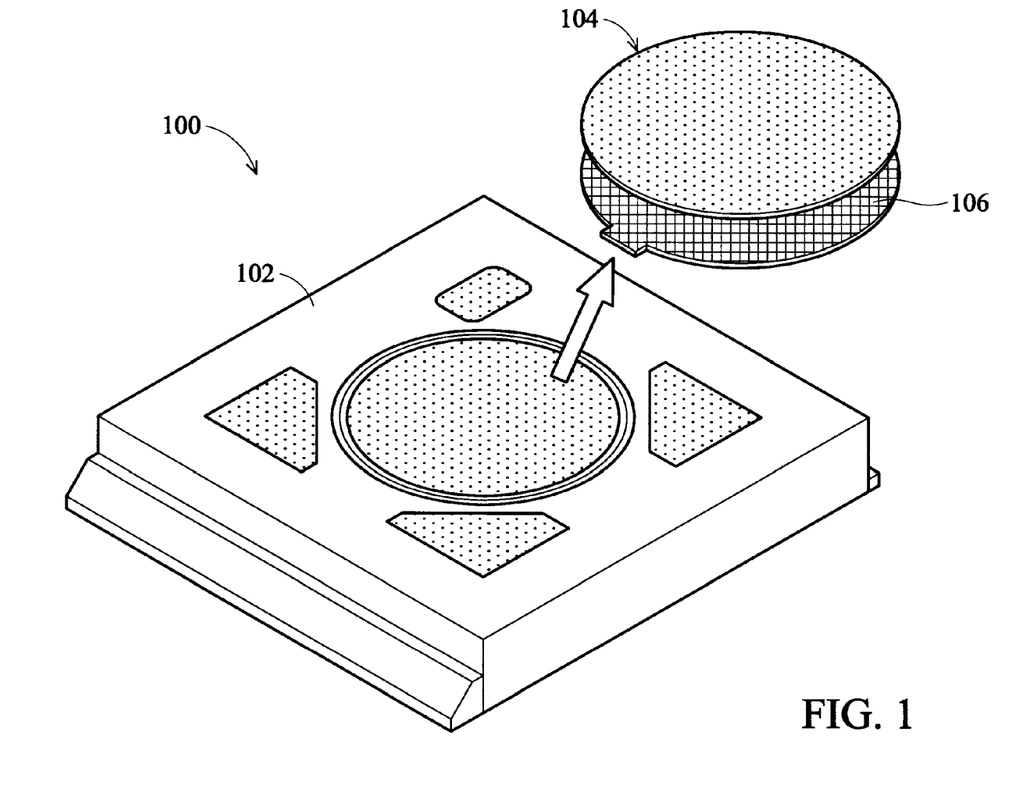
FIG. 1 illustrates a portion of an immersion scanner showing a cooling water channel for LCW disposed within the wafer table thereof.

FIG. 1 illustrates a portion of an immersion scanner 100 including a mirror block 102 and a wafer table 104. The wafer table 104 includes an LCW channel 106 disposed throughout the interior thereof. During operation of the immersion scanner 100, LCW throughput the channel 106 stabilizes the temperature of the wafer table 104. It will be recognized, however, that overlay performance will be impacted by internal stresses caused by changes in pressure of the LCW. Specifically, LCW-induced stresses may result in a 3-4 nanometer ("nm") overlay error, which currently cannot be completely resolved.

Figure 2:
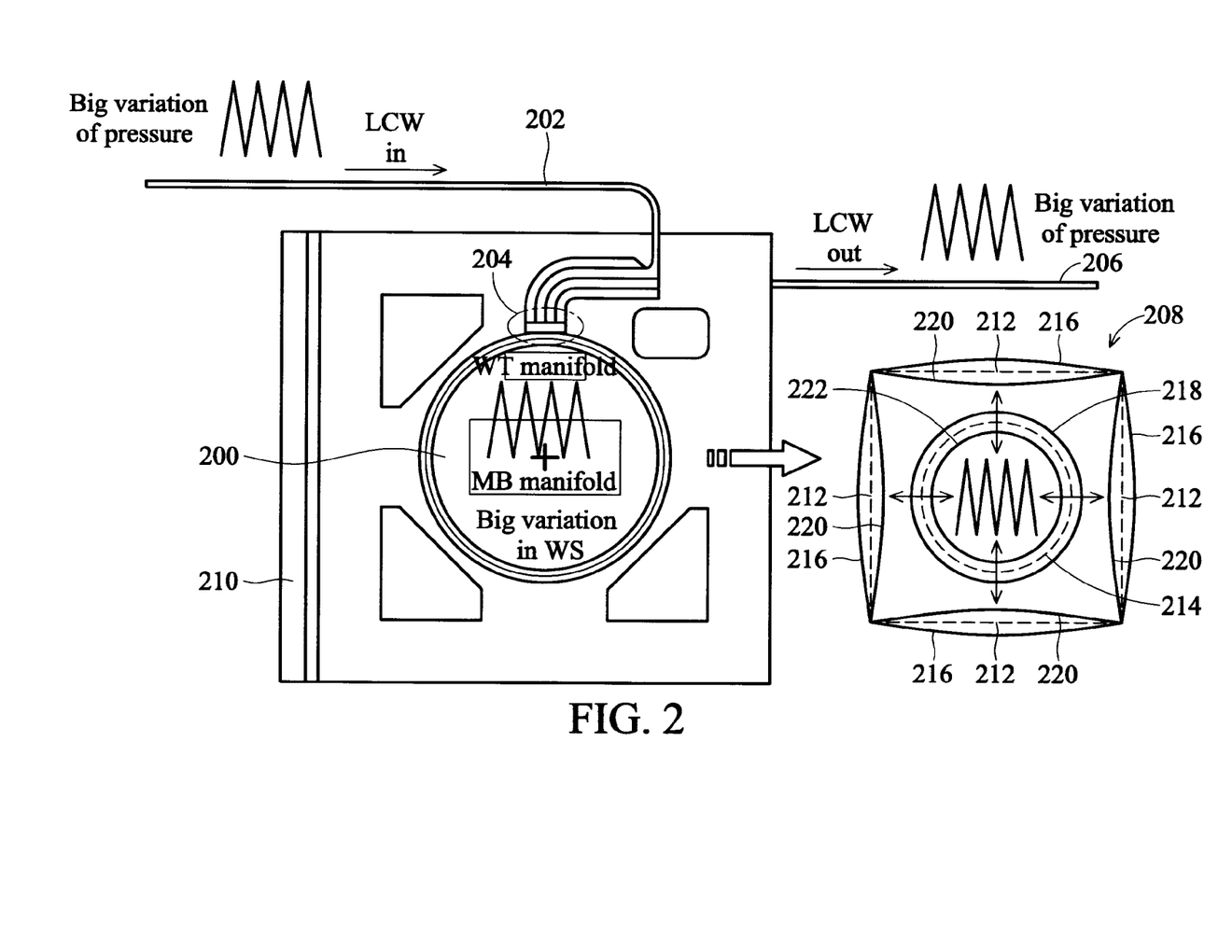
FIG. 2 illustrates the effect of pressure variations in the LCW throughput a cooling water channel of an immersion scanner wafer table.

FIG. 2 illustrates the effect of pressure variations in the LCW throughput a cooling water channel of an immersion scanner wafer table. As shown in FIG. 2, LCW is input to a wafer table 200 via an input 202 to a manifold 204. The LCW is output from the wafer table 200 via an output 206 from the manifold 204. A diagram 208 illustrates distortions induced in the wafer table 200 and surrounding mirror block 210 by pressure variations in the LCW throughput the wafer table 200. Dashed lines 212 represent the normal shape of the mirror block 210. A dashed line 214 represents the normal shape of the wafer table 200. Solid lines 216 and solid line 218 respectively represent the distorted shape of the mirror block 210 and the wafer table 200 when LCW pressure is high. Conversely, solid lines 220 and solid line 222 respectively represent the distorted shape of the mirror block 210 and the wafer table 200 when LCW pressure is low.

Figure 3:
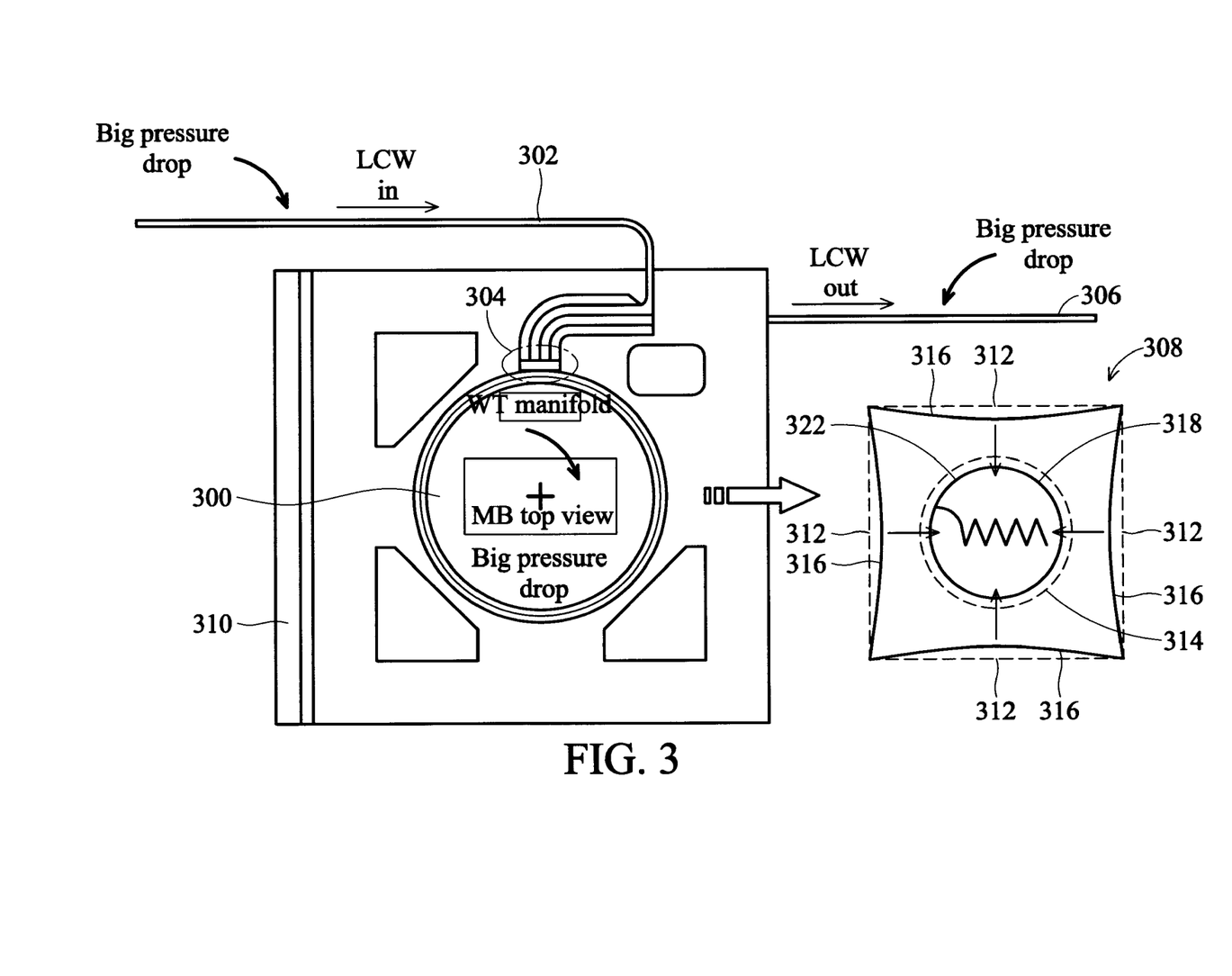
FIG. 3 illustrates the effect of a sharp drop in the pressure of the LCW throughput a cooling water channel of an immersion scanner wafer table.

FIG. 3 illustrates the effect of a sharp drop in the pressure of the LCW throughput a cooling water channel of an immersion scanner wafer table. As shown in FIG. 3, LCW is input to a wafer table 300 via an input 302 to a manifold 304. The LCW is output from the wafer table 300 via an output 306 from the manifold 304. A diagram 308 illustrates distortions induced in the wafer table 300 and surrounding mirror block 310 by pressure variations in the LCW throughput the wafer table 300. Dashed lines 312 represent the normal shape of the mirror block 310. A dashed line 314 represents the normal shape of the wafer table 300. Solid lines 316 and solid line 318 respectively represent the distorted shape of the mirror block 310 and the wafer table 300 after a sharp drop in LCW pressure. Such a sharp drop may be caused by Emergency Machine Off ("EMO") shutdown, for example.

Figure 4:
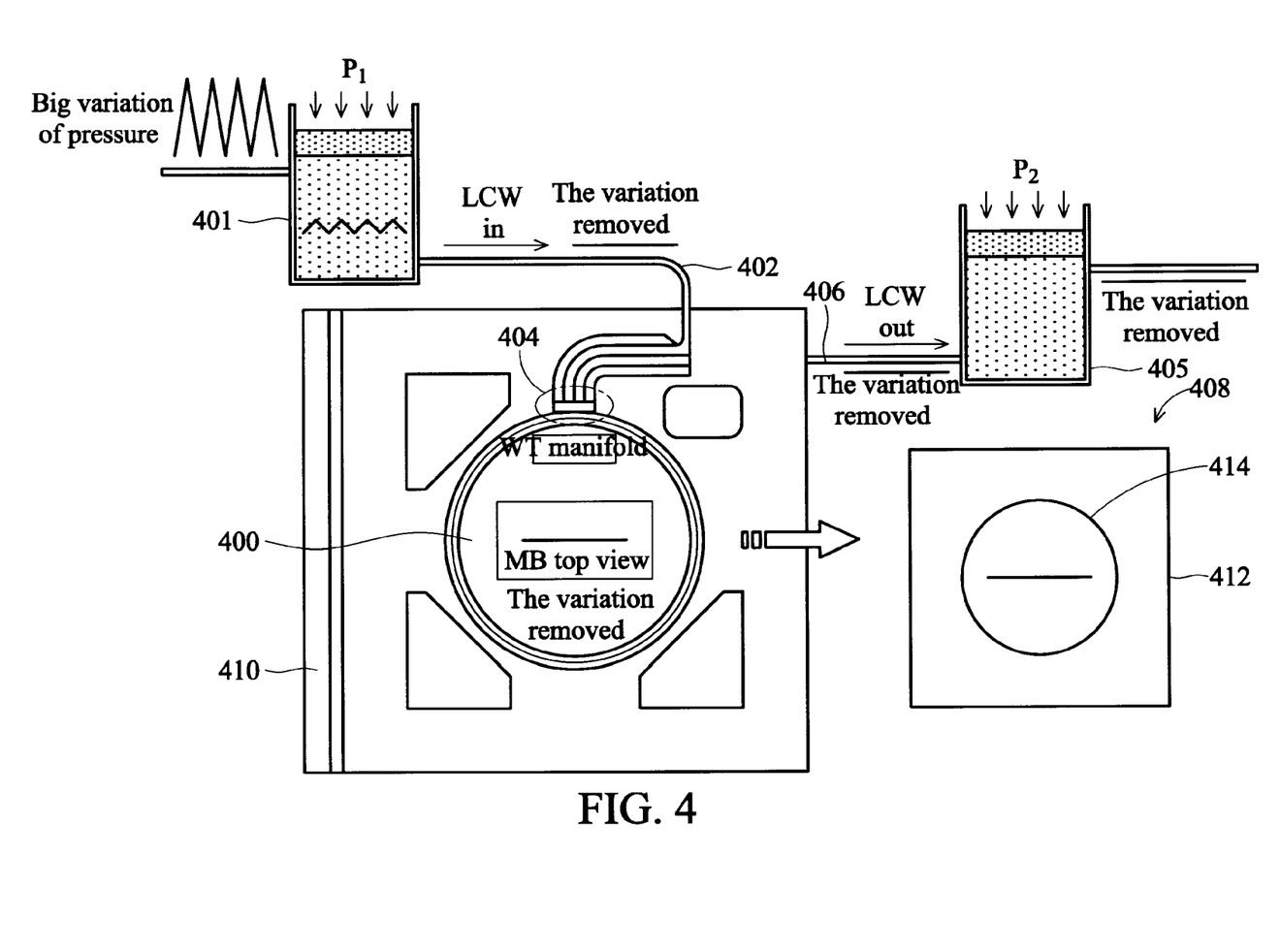
FIG. 4 illustrates the effect of a technique for compensating for pressure variations in the LCW throughput a cooling water channel of an immersion scanner wafer table in accordance with an embodiment.

FIG. 4 illustrates the effect of a technique for compensating for pressure variations in the LCW throughput a cooling water channel of an immersion scanner wafer table in accordance with an embodiment. As shown in FIG. 4, water for use as LCW in a wafer table 400 is first input to a pressure-controlled container 401, wherein the water is maintained at a pressure P1, thereby to eliminate the pressure variations induced therein by various factors at the input to the wafer table 400. LCW output from the container 401 is input to the wafer table 400 via an input 402 to a manifold 404. The LCW is output from the wafer table 400 to a second pressure-controlled container 405 via an output 406 from the manifold 404. Water in the second container 405 is maintained at a pressure P2, thereby to eliminate the pressure variations induced therein by various factors at the output of the wafer table 400. In one embodiment, P1 and P2 are within a range of 300-700 kilopascals and P1 minus P2 is a constant greater than zero.

A diagram 408 illustrates the effect of the technique on the wafer table 400 and surrounding mirror block 410. As the diagram 408 illustrates, because there are no pressure variations in the LCW throughput the water table 400, distortions in the wafer table and mirror block 410 are eliminated; therefore, a line 412 represents the normal shape of the mirror block 410, while a line 414 represents the normal shape of the wafer table 400.

Figure 5:
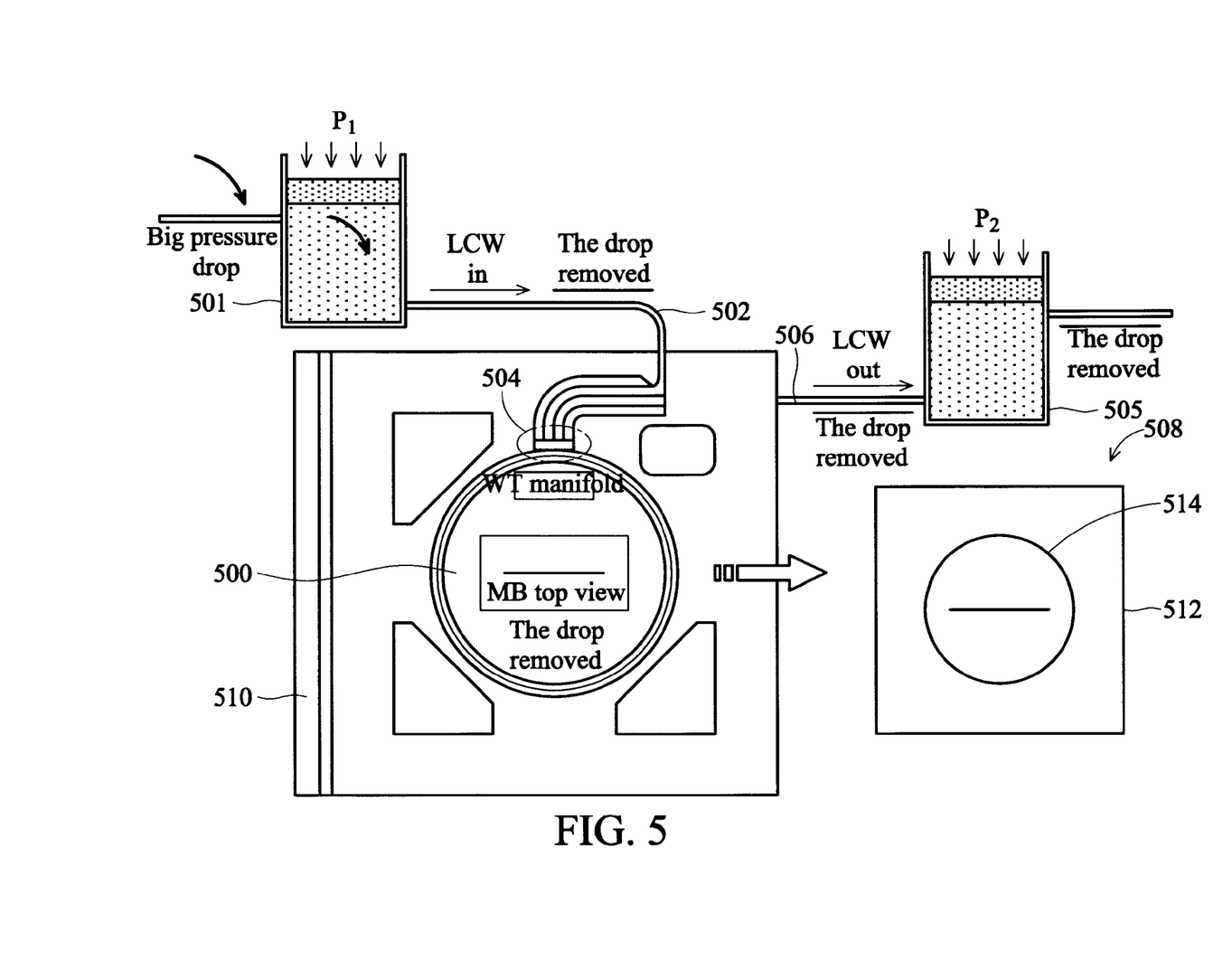
FIG. 5 illustrates the effect of a technique for compensating for a sharp drop in pressure of the LCW throughput a cooling water channel of an immersion scanner wafer table in accordance with an embodiment.

FIG. 5 illustrates the effect of a technique for compensating for a sharp drop in pressure of the LCW throughput a cooling water channel of an immersion scanner wafer table in accordance with an embodiment. As shown in FIG. 5, water for use as LCW in a wafer table 500 is first input to a pressure-controlled container 501, wherein the water is maintained at a pressure P1, thereby to eliminate the pressure variations induced therein by a drop in pressure caused by, for example, an EMO, at the input to the wafer table 500. LCW output from the container 501 is input to the wafer table 500 via an input 502 to a manifold 504. The LCW is output from the wafer table 500 to a second pressure-controlled container 505 via an output 506 from the manifold 504. Water in the second container 505 is maintained at a pressure P2, thereby to eliminate the pressure variations induced therein by a pressure drop at the output of the wafer table 500. In one embodiment, P1 and P2 are within a range of 300-700 kPa and P1 minus P2 is a constant greater than zero. A diagram 508 illustrates the effect of the technique on the wafer table 500 and surrounding mirror block 510. As the diagram 508 illustrates, because there are no pressure variations in the LCW throughput the water table 500, distortions in the wafer table and mirror block 510 are eliminated; therefore, a line 512 represents the normal shape of the mirror block 510, while a line 514 represents the normal shape of the wafer table 500.

Figure 6:
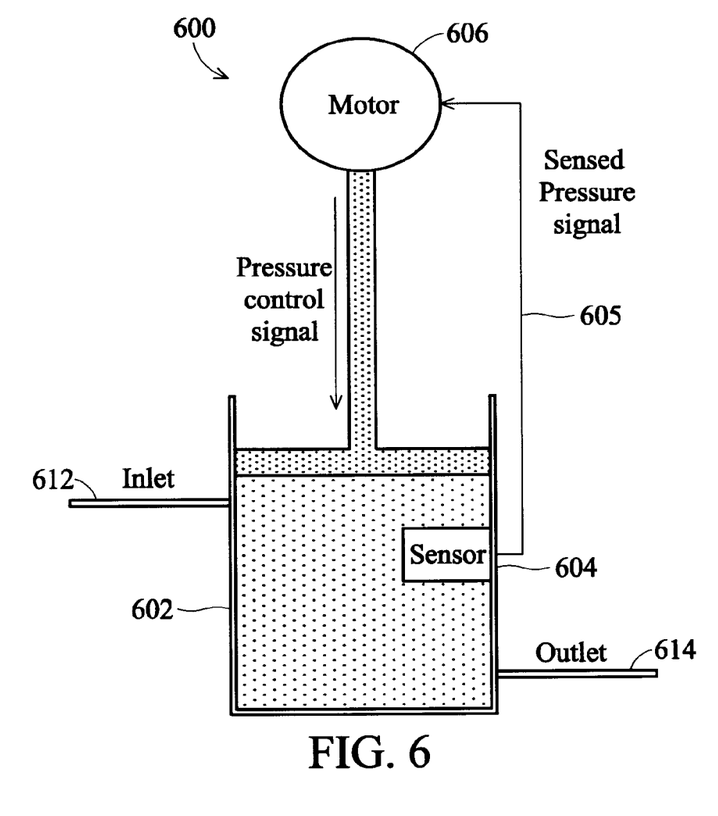
FIG. 6 illustrates a system for responding to and compensating for a variety of pressure variations in an LCW supply in accordance with an embodiment.

In FIG. 6, reference numeral 600 designates a pressurized container, such as the pressurized containers 401, 405 (FIG. 4), and 501, 505 (FIG. 5), in accordance with features of an embodiment. The container 600 includes a tank 602 for containing water to be pressurized. A pressure sensor 604 is associated with the tank 602 for sensing a pressure of the water in the tank and providing a sensed pressure signal 605 representative of the sensed pressure to a motor 606. During operation (i.e., during exposure of a wafer), the motor 606 applies appropriate pressure to the water in the tank 602 to maintain the pressure at P1 or P2 (see FIGS. 4 and 5). Water is input to the tank 602 via an inlet 612 and output therefrom via an outlet 614.

In one embodiment, the motor 606 adjusts the pressure applied to the water in the tank 602 based solely on the sensed pressure signal 605 from the pressure sensor 604 to maintain the pressure at P1 (if the container 600 is disposed at the LCW input) or P2 (if the container 600 is disposed at the LCW output). In another embodiment, as described in greater detail with reference to FIG. 7, the motor implements a pressure control algorithm for determining the pressure to apply to the water in the tank 602.

Figure 7:
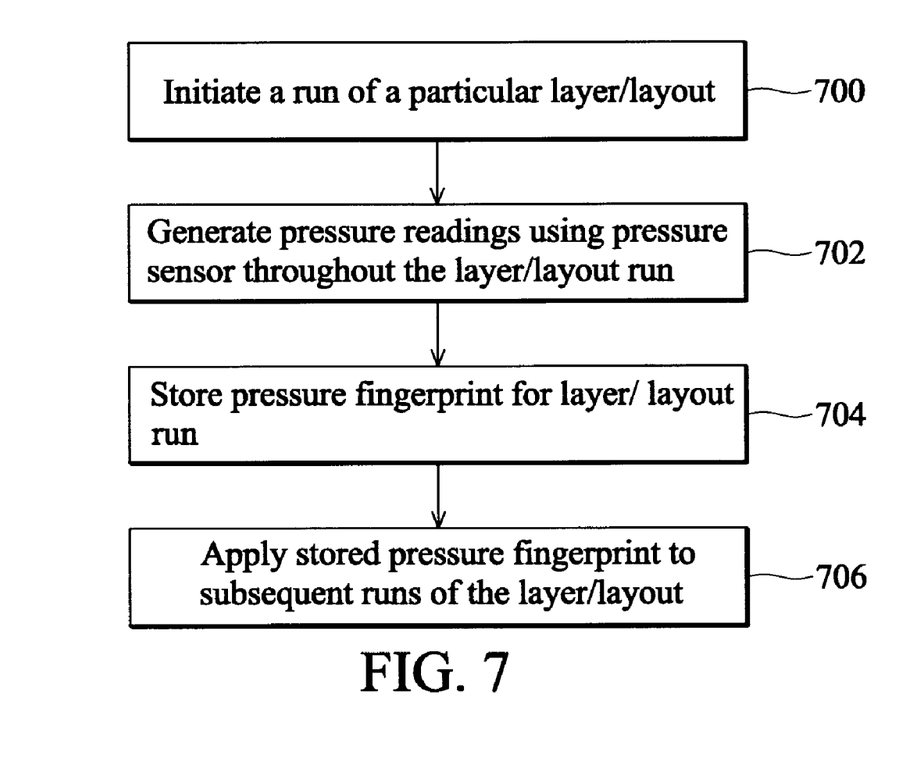
FIG. 7 illustrates a method of responding to and compensating for a variety of pressure variations in an LCW supply in accordance with an embodiment.

It will be recognized that similar LCW pressure change patterns may be induced in the wafer table each time a particular layer/layout is run. Therefore, in one embodiment, a number of layer/layouts are run, with the LCW pressure, as measured by the tank sensor, recorded by a pressure control module associated with the motor. The recorded LCW pressure pattern, or "pressure fingerprint" can be subsequently used to assist the motor in determining the pressure to apply the next time the same layer/layout is run. This technique is illustrated in FIG. 7.

In step 700, an immersion scanner including features of the embodiments described hereinabove (e.g., in FIG. 5) is used to implement a particular layer/layout run. It will be recognized that the normal movement of a wafer and wafer table during such a run will induce changes in the LCW within the wafer table. Simultaneously with step 700, in step 702, the sensor disposed in the water tank generates readings of the pressure in the tank throughout the run. In step 704, the pressure readings, which comprise a "pressure fingerprint" for the particular layout and layer, is stored. Thereafter (e.g., in step 708), when is the same layer/layout run is executed, the recorded pressure fingerprint is applied by the motor to appropriately control the pressure applied to the water in the tank to eliminate pressure variations in the LCW.

One embodiment is a method of improving overlay performance of an photolithography immersion scanner comprising a wafer table having lens cooling water ("LCW") disposed in a water channel therein, the wafer table having an input for receiving the LCW into the water channel and an output for expelling the LCW from the water channel. The method comprises providing a water tank at least one of the wafer table input and the wafer table output; monitoring a pressure of water in the water tank; and maintaining the pressure of the water in the water tank at a predetermined level.

Another embodiment is a photolithography immersion scanner comprising a wafer table having lens cooling water ("LCW") disposed in a water channel therein, the wafer table having an input for receiving the LCW into the water channel and an output for expelling the LCW from the water channel. The scanner further comprises a water tank provided at least one of the wafer table input and the wafer table output; a sensor associated with the water tank for monitoring a pressure of water in the water tank; and a motor for maintaining the pressure of the water in the water tank at a selected level.

Yet another embodiment is an improved photolithography immersion scanner comprising a wafer table having lens cooling water ("LCW") disposed in a water channel therein, the wafer table having an input for receiving the LCW into the water channel and an output for expelling the LCW from the water channel. The scanner further comprises water receptacle means provided at least one of the wafer table input and the wafer table output; means for monitoring a pressure of water in the water tank; and means for maintaining the pressure of the water in the water tank at a selected level.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of improving overlay performance of an photolithography immersion scanner comprising a wafer table having lens cooling water ("LCW") disposed in a water channel therein, the wafer table having an input for receiving the LCW into the water channel and an output for expelling the LCW from the water channel, the method comprising:
providing a water tank that connects to at least one of the wafer table input and the wafer table output;
monitoring a pressure of water in the water tank; and
maintaining the pressure of the water in the water tank at a predetermined positive level, wherein the maintaining comprises applying a pressure fingerprint associated with a current layer and layout run.

2. The method of claim 1 wherein the providing the water tank comprises:
providing a first water tank at the wafer table input; and
providing a second water tank at the wafer table output;
wherein the LCW is received into the water channel via the first water tank; and
wherein the LCW is expelled from the water channel via the second water tank.

3. The method of claim 2 wherein the maintaining further comprises:
maintaining the pressure of the water in the first water tank at a first positive level P1; and
maintaining the pressure of the water in the second water tank at a second positive level P2.

4. The method of claim 3 wherein P1 minus P2 is equal to a constant greater than zero.

5. The method of claim 1 wherein the monitoring further comprises providing a pressure sensor associated with the water tank, the pressure sensor for generating a sensed pressure signal indicative of a pressure of the water in the tank.

6. The method of claim 5 wherein the maintaining comprises providing a motor for applying pressure to the water in the water tank responsive to the sensed pressure signal from the pressure sensor.

7. A photolithography immersion scanner comprising a wafer table having lens cooling water ("LCW") disposed in a water channel therein, the wafer table having an input for receiving the LCW into the water channel and an output for expelling the LCW from the water channel, the scanner further comprising:
a water tank connected to at least one of the wafer table input and the wafer table output;
a sensor associated with the water tank for monitoring a pressure of water in the water tank; and
a motor for maintaining the pressure of the water in the water tank at a selected level;
wherein the motor maintains the pressure of the water in the water tank at a predetermined level by applying a pressure fingerprint associated with a current layer and layout run.

8. The scanner of claim 7 wherein the water tank comprises:
a first water tank at the wafer table input, wherein the LCW is received into the water channel via the first water tank; and
a second water tank at the wafer table output, wherein the LCW is expelled from the water channel via the second water tank.

9. The scanner of claim 8 wherein the motor comprises:
a first motor for maintaining the pressure of the water in the first water tank at a first level P1; and
a second motor for maintaining the pressure of the water in the second water tank at a second level P2.

10. The scanner of claim 9 wherein P1 minus P2 is equal to a constant greater than zero.

11. The scanner of claim 7 wherein the sensor generates a sensed pressure signal indicative of a monitored pressure of the water in the tank.

12. The scanner of claim 11 wherein the motor adjusts a pressure of the water responsive to receipt of the sensed pressure signal.

13. An improved photolithography immersion scanner comprising a wafer table having lens cooling water ("LCW") disposed in a water channel therein, the wafer table having an input for receiving the LCW into the water channel and an output for expelling the LCW from the water channel, the scanner further comprising:
water receptacle means connected to at least one of the wafer table input and the wafer table output;
means for monitoring a pressure of water in the water receptacle means; and
means for maintaining the pressure of the water in the water receptacle means at a selected level;
wherein the means for maintaining comprises means for applying a pressure fingerprint associated with a current layer and layout run.

14. The scanner of claim 13 wherein the water receptacle means comprises:
a first water tank at the wafer table input, wherein the LCW is received into the water channel via the first water tank; and
a second water tank at the wafer table output, wherein the LCW is expelled from the water channel via the second water tank.

15. The scanner of claim 14 wherein the means for maintaining further comprises:
means for maintaining the pressure of the water in the first water tank at a first level P1; and
means for maintaining the pressure of the water in the second water tank at a second level P2;
wherein P1 minus P2 is equal to a constant greater than zero.

16. The scanner of claim 13 wherein the means for monitoring comprises a pressure sensor associated with the water receptacle means, the pressure sensor for generating to the means for maintaining a sensed pressure signal indicative of a pressure of the water in the receptacle means.

17. The scanner of claim 16 wherein the means for maintaining comprises a motor for applying pressure to the water in the water receptacle means responsive to the sensed pressure signal.

* * * * *